(12) United States Patent
Eytcheson

(10) Patent No.: US 6,822,331 B2
(45) Date of Patent: Nov. 23, 2004

(54) METHOD OF MOUNTING A CIRCUIT COMPONENT AND JOINT STRUCTURE THEREFOR

(75) Inventor: Charles T. Eytcheson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/881,554

(22) Filed: Jun. 14, 2001

(65) Prior Publication Data

US 2002/0190388 A1 Dec. 19, 2002

(51) Int. Cl.[7] .......................................... H01L 21/4763
(52) U.S. Cl. ....................... 257/773; 257/712; 257/762; 257/717; 438/687; 438/653
(58) Field of Search ................................ 257/773, 783, 257/787, 778, 774, 737, 738, 713; 438/106, 119, 118

(56) References Cited

U.S. PATENT DOCUMENTS

| | | | | |
|---|---|---|---|---|
| 4,529,836 A | * | 7/1985 | Powers et al. ................. 174/94 |
| 5,088,007 A | * | 2/1992 | Missele ....................... 361/386 |
| 5,136,122 A | * | 8/1992 | Kwitkowski et al. .......... 174/94 |
| 5,221,399 A | * | 6/1993 | Sanborn et al. ............. 156/285 |
| 5,502,889 A | * | 4/1996 | Casson et al. ................. 29/830 |
| 5,591,034 A | * | 1/1997 | Ameen et al. ................ 439/91 |
| 5,903,439 A | * | 5/1999 | Tamarkin ..................... 361/742 |
| 5,986,912 A | * | 11/1999 | Hsiao et al. ................. 363/147 |
| 6,012,223 A | | 1/2000 | Hinze |
| 6,083,772 A | * | 7/2000 | Bowman et al. ............. 438/106 |
| 6,096,414 A | * | 8/2000 | Young ......................... 428/220 |
| 6,233,817 B1 | | 5/2001 | Ellis et al. |
| 6,251,501 B1 | | 6/2001 | Higdon et al. |
| 6,280,584 B1 | * | 8/2001 | Kumar et al. .......... 204/298.15 |
| 6,297,564 B1 | * | 10/2001 | Chung ......................... 257/783 |
| 6,307,755 B1 | * | 10/2001 | Williams et al. ............ 361/813 |
| 6,375,062 B1 | | 4/2002 | Higdon et al. |
| 6,614,108 B1 | | 9/2003 | Sanftleben et al. |

OTHER PUBLICATIONS

IBM Technical Disclosure Bulletin, NN600469, Apr. 1960.*
NN600469, 04–1960.*

* cited by examiner

Primary Examiner—Nathan J. Flynn
Assistant Examiner—Fazli Erdem
(74) Attorney, Agent, or Firm—Stefan V. Chmielewski

(57) ABSTRACT

A joint structure and method for bonding together two components, such as when attaching an electrical circuit element to a conductor on a substrate. The joint structure comprises a mesh infiltrated by a solder material, in which the mesh is preferably formed of a material having a higher thermal conductivity than the solder material. The joint structure is able to offer improvements in thermal conductivity, electrical conductivity, reflow processing, and stress distribution between the structures it connects. Each of these attributes of the joint structure can be tailored to some degree by the choices of materials for the mesh and the solder material.

36 Claims, 3 Drawing Sheets

METHOD OF MOUNTING A CIRCUIT COMPONENT AND JOINT STRUCTURE THEREFOR

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to bonding methods, such as when mounting silicon devices and packaged electronic circuit devices and packages to copper, ceramic thick film and other substrate materials, and mounting interconnect straps to silicon power devices as a replacement for conventional wire bonding. More particularly, this invention relates to a method for soldering materials having different coefficients of thermal expansion (CTE) by forming a joint structure that improves stress distribution so as to improve the thermal fatigue resistance of the joint, while also promoting and improving heat transfer through the joint and maintaining or promoting the electrical conductivity of the joint, in part by inhibiting void formation within the joint.

(2) Description of the Related Art

A variety of approaches are known for dissipating heat generated by high power semiconductor surface-mount (SM) devices. For example, heat-generating integrated circuit (IC) chips are often mounted to ceramic substrates, which have higher thermal conductivities than laminate substrates such as printed circuit boards (PCB). Alternatively or in addition, a device may be soldered to a thermal conductor or heatsink on a substrate to increase heat transfer away from the chip, yielding a structure referred to as a "thermal stack." Because semiconductor devices (e.g., silicon), conductors (e.g., copper) and circuit boards (e.g., ceramics and laminates) have widely varying coefficients of thermal expansions (CTE), the solder joint of a thermal stack is subject to thermal fatigue if the assembly is exposed to extreme temperature cycles, as occurs in many automotive applications. The solder joint may shear or crack due to thermal fatigue, thereby reducing heat transfer from the device and leading to device overheating.

Thin solder joints with minimum voiding are required to achieve adequate heat transfer through thermal stacks used with high power semiconductors. A thin solder joint (e.g., about 0.003 inch, about 80 micrometers) is preferred because of the relatively low thermal conductivity of solders as compared to the other materials typically used in high power semiconductor thermal stacks. For example, the coefficients of thermal conductivity (k) for 60 Sn/40 Pb and 25 Sn/75 Pb solders are about 46 and 38 W/mK, respectively, as compared to copper and silicon with coefficients of about 399 and 83 W/mK, respectively. However, a thin solder joint is more susceptible to thermal fatigue if the materials it joins have widely varying CTE's, such as a silicon power IC and a copper heatsink. If a soft solder is used, a fatigue fracture is most likely to initiate at the outer periphery of the solder joint and propagate toward the center, reducing the area through which heat transfer occurs until the device eventually overheats. In contrast, if a hard solder is used in the thermal stack, a fatigue crack may originate in one of the adjacent materials. For example, in an application in which a silicon chip is soldered to copper, a fatigue crack may initiate in the silicon chip.

As noted above, minimum voiding is also required to achieve adequate heat transfer through the solder joint of a thermal stack. Solder voiding occurs in solder joints in part as a result of the capillary action that draws the surfaces being jointed together. In a thin solder joint, this capillary action can inhibit the ability for flux volatiles and gases to escape the solder joint, with the result that gas bubbles remain trapped in the solder joint. Solder joints containing many voids or a few large voids have significantly reduced heat transfer capability because the voids are barriers to heat flow. Voids can also provide a path for crack propagation through the solder joint. Large voids present at the bottom surface of a die are particularly detrimental to a silicon die.

As a solution to the above problems, solder joints of greater thicknesses have been employed to better distribute the thermally-induced stresses through the thickness of the solder joint, utilizing the ductility of the solder to buffer the CTE mismatch. While doing so has the capability of improving thermal fatigue resistance, there is a point at which the solder thickness is such that the CTE mismatch between the solder and either of the adjacent materials may become a primary source of crack initiation. This thickness is the minimum spacing desired to achieve between materials with a CTE mismatch, and will depend in part on joint area (e.g., die size) and the particular materials present in the thermal stack. In addition to the difficulty of determining this minimum solder thickness, there is the difficulty of producing a thick solder joint to a minimum thickness, such as in the range of about 0.010 to 0.025 inch (about 250 to 635 micrometers). Furthermore, and as noted above, increasing the thickness of the solder joint has the effect of increasing the thermal and electrical resistances of the circuit because of the relatively low thermal and electrical conductivity of solders. Finally, it is thought that thicker solder joints may increase the probability of voiding.

In view of the above, it would be desirable if the thermal stresses of a thermal stack could be reduced without incurring the performance and processing shortcomings associated with the use of thicker solder joints.

BRIEF SUMMARY OF THE INVENTION

The present invention is directed to a joint structure and bonding method, such as when attaching an electrical circuit element to a substrate or a conductor on a substrate. The joint structure comprises a mesh infiltrated by a solder material. The mesh is preferably formed of a material having a higher thermal conductivity than the solder material. In a preferred embodiment, the mesh is formed of woven strands formed of copper or a copper alloy, such that the mesh is able to significantly improve the thermal conductivity of the joint structure beyond that possible with conventional solder materials.

In view of the above, several benefits can be realized with the present invention. One important benefit is that the mesh can be used to positively establish the thickness of the joint structure, such that the thickness of the joint structure can be tailored to improve the thermal fatigue resistance of the assembly by better distributing thermal stresses arising from a CTE mismatch between the solder and the materials of the circuit element and substrate. However, the joint structure of the present invention does not suffer from the shortcomings associated with thick solder joints of the prior art. For example, the improved fatigue resistance made possible with the greater thicknesses of the joint structure is not achieved at the expense of thermal conductivity, because the mesh fills the solder joint structure and acts as a composite material. If formed of copper or another highly thermally conductive material, the mesh is able to improve the thermal and electrical conductivity of the joint structure beyond that possible with a thin (e.g., 0.003 inch (80 micrometers)) unfilled solder joint. Furthermore, the mesh appears to further improve the resistance of the joint structure to fatigue cracking because it inhibits the creation of a thin shear plane within the joint structure. The individual columns of woven strands in the mesh are able to expand and contract independently of each other, thereby minimizing the total effect of any CTE mismatch between the mesh (e.g., copper) and the adjacent materials (e.g., silicon). Finally, the mesh provides multiple paths by which flux and other gases can escape the joint structure, such that the formation of relatively large voids in the joint structure is reduced. Any large voids (e.g., contaminants that are not able to escape) are broken up by the mesh and reduced to smaller voids that are distributed and confined to openings in the mesh, so that uniform contact is obtained between the joint structure and the elements it is bonding (e.g., a die) to provide good thermal and electrical conduction.

Other objects and advantages of this invention will be better appreciated from the following detailed description.

DETAILED DESCRIPTION OF THE INVENTION

Figure 1:
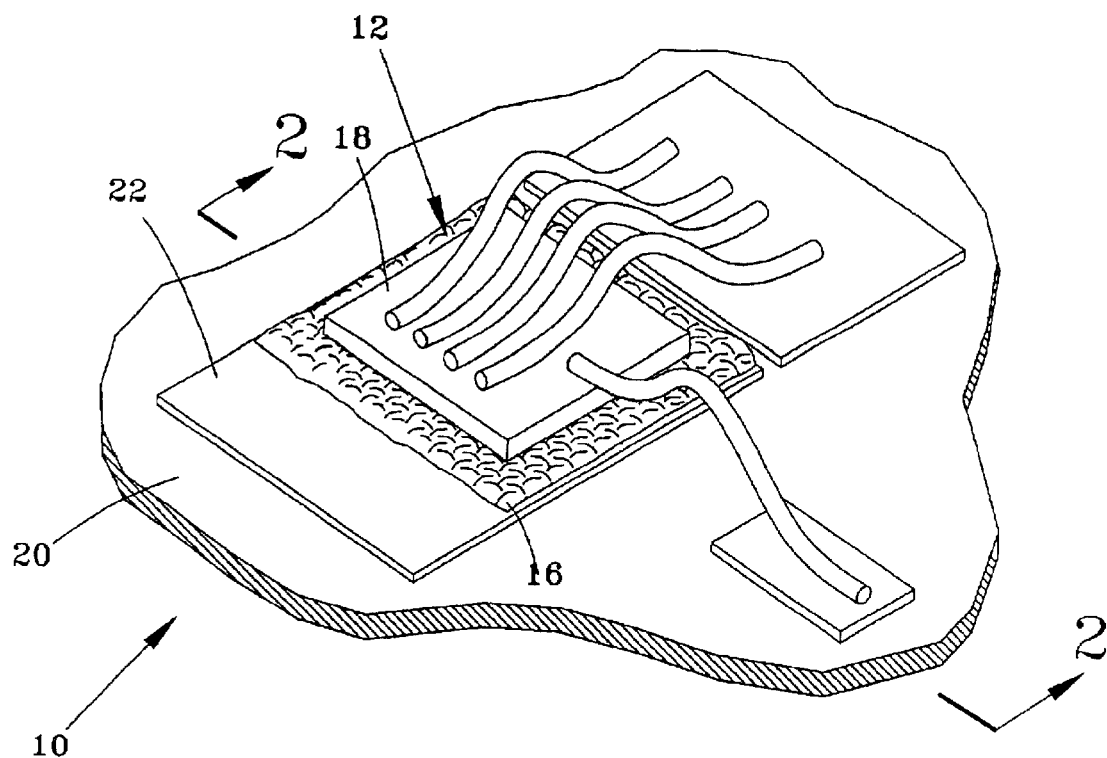
FIG. 1 represents a circuit assembly that utilizes a joint structure formed in accordance with the present invention.
Figure 2:
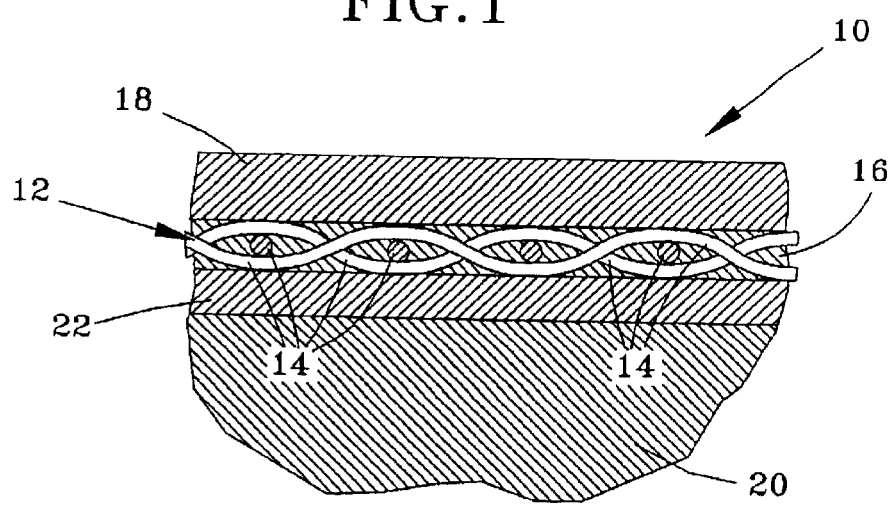
FIG. 2 is a partial cross-sectional view through the circuit assembly of FIG. 1.

FIGS. 1 and 2 represent a circuit assembly 10 that utilizes a joint structure 12 configured in accordance with the present invention for attaching a semiconductor circuit device 18 to a substrate 20, such as a circuit board. In FIG. 1, the circuit device 18 is represented as being a power integrated circuit (IC) chip, which is bonded by the joint structure 12 to a conductor 22 on the substrate 20. The conductor 22 may be a copper foil or a thick-film conductor in accordance with known practices, and serves to conduct heat away from the device 18 and into the underlying substrate 20. In its role represented in FIGS. 1 and 2, the joint structure 12 fills the area between the device 18 and conductor 22, which are typically formed of materials having widely varying CTE's, such as silicon and copper, respectively. For this reason, the joint structure 12 is configured to absorb the thermal stresses that arise when the assembly 10 is subjected to temperature cycling. As seen in FIG. 1, the joint structure 12 comprises a screen mesh 14 that is infiltrated with a solder 16. The term "solder" is used to denote a material with a relatively low melting point that can be reflowed at temperatures below which the particular device 18 would be damaged. The mesh 14 is formed of a material having a higher thermal conductivity than the material of the solder 16, a notable example of which is copper with a higher coefficient of thermal conductivity (about 399 W/mK) than solder metals such as tin, lead and antimony (about 66, 35 and 22 W/mK, respectively). A preferred material for the mesh 14 is woven copper wire, also referred to as a wire cloth, infiltrated with a soft solder such as tin-lead solders containing 5 to 63 weight percent tin with the balance lead, a preferred alloy being 25 Sn-75 Pb. Other suitable materials for the mesh 14 are possible, while a variety of low melting materials could be used as the solder 16.

The mesh 14 is shown in FIG. 1 as a single ply of wires woven in a conventional "plain weave" of warp and weft strands, as these terms are conventionally used in the art. However, it is foreseeable that the joint structure 12 could employ multiple layers of the mesh 14. In addition, while the mesh 14 is shown as a plain weave in which each wire passes over and under successive transverse wires, one wire at a time, other weave patterns could foreseeably be used. Suitable mesh materials for use in the joint structure 12 of this invention are commercially available from a variety of sources. Two plain weave copper meshes that have been used with the invention have copper wires of about 0.011 and about 0.015 inch (about 0.28 to about 0.38 millimeters) in diameter, in a weave of sixteen and twenty-two wire strands per linear inch (about 6.3 to about 8.7 wire strands per linear centimeter), respectively.

The individual columns of wire in the mesh 14 are believed to act substantially independently of each other, and therefore inhibit the creation of a thin shear plane through the joint structure 12 that would promote fracturing of the joint structure 12 from thermal fatigue. As seen from FIG. 2, the mesh 14 may also be capable of preserving and possibly controlling the thickness of the joint structure 12 to some extent if the mesh 14 is used as a positive support for the device 18. As a result, a sufficiently thick joint structure 12 can be formed that may better distribute thermal stresses arising from a CTE mismatch between the solder 16 and the materials of the circuit device 18, substrate 20 and conductor 22. With the use of appropriate materials for the mesh 14, there is also the potential for improving the thermal conductivity of the joint structure 12 to enhance heat dissipation from the device 16.

A suitable method of forming the joint structure 12 shown in FIGS. 1 and 2 is to form a preliminary structure by applying a suitable flux on the conductor 22, placing the mesh 14 on the fluxed conductor 22, and then placing a solder preform on the mesh 14. The lower surface of the device 18 is then fluxed before being placed on the solder preform. This preliminary structure is then heated on a hot plate to a temperature sufficient to melt the particular solder composition, so that the molten solder wets and infiltrates the mesh 14, and wets the device 18 and conductor 22. In this manner, volatile constituents of the flux are released and allowed to escape as the solder melts and flows throughout the mesh 14. An alternative method is to form the preliminary structure in a ceramic boat for reflow in a belt furnace. If a hydrogen furnace is used, the preliminary structure does not require the use of flux.

On cooling, the solidified solder 16 has a structure similar to many individual columns of solder through the openings in the mesh 14. The solder columns are connected to each other by fillets at the surfaces of the device 18 and conductor 22, but are otherwise generally independent of each other such that the solder 16 is able to further improve the thermal cycle life of the joint structure 12. In addition, solder voiding that would result from the gases formed during reflow, including those produced when the flux melts, is controlled and minimized because the mesh 14 prevents the joint structure 12 from collapsing and trapping the gases during reflow, and provides numerous routs for the gases to escape.

Figure 3:
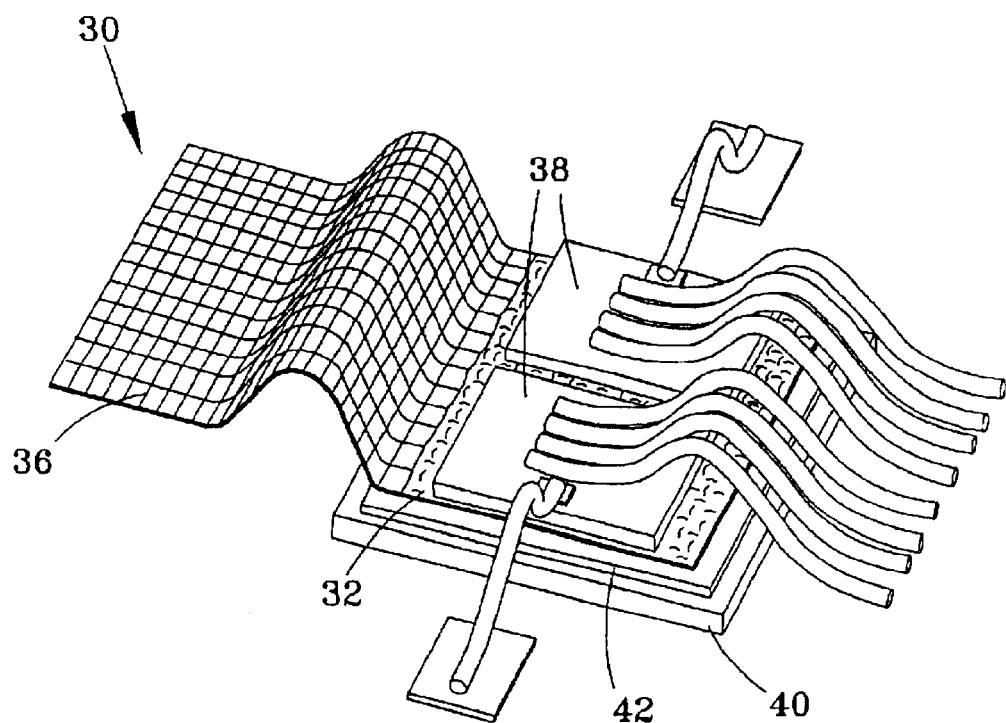
FIGS. 3 through 6 illustrate three additional applications for the joint structure of this invention, as well as additional structures that can be constructed similarly to the joint structure.

FIGS. 3 through 6 illustrate different applications for the joint structure 12 of FIG. 1. In a circuit assembly 30 represented in FIG. 3, a joint structure 32 in accordance with this invention is shown as bonding a pair of field effect transistors (FET's) 38 to a conductor 42 on a ceramic substrate 40, such as beryllium oxide (BeO). In such an application, the FET's 38 can be bonded to the joint structure 32, and then the assembly 30 bonded to another substrate or circuit board (not shown) with a conventional solder composition having a lower melting temperature than that of the solder used in the joint structure 32. The joint structure 32 of FIG. 3 is formed of a solder-infiltrated mesh similar to the structure 12 of FIGS. 1 and 2, but differs by the inclusion of a jumper 36 formed by a portion of the mesh 14 that extends outside of the joint structure 32. Because it is free of solder, the jumper 36 remains flexible, allowing for its use to connect the FET's 38 to a bus structure (not shown).

Figure 4:
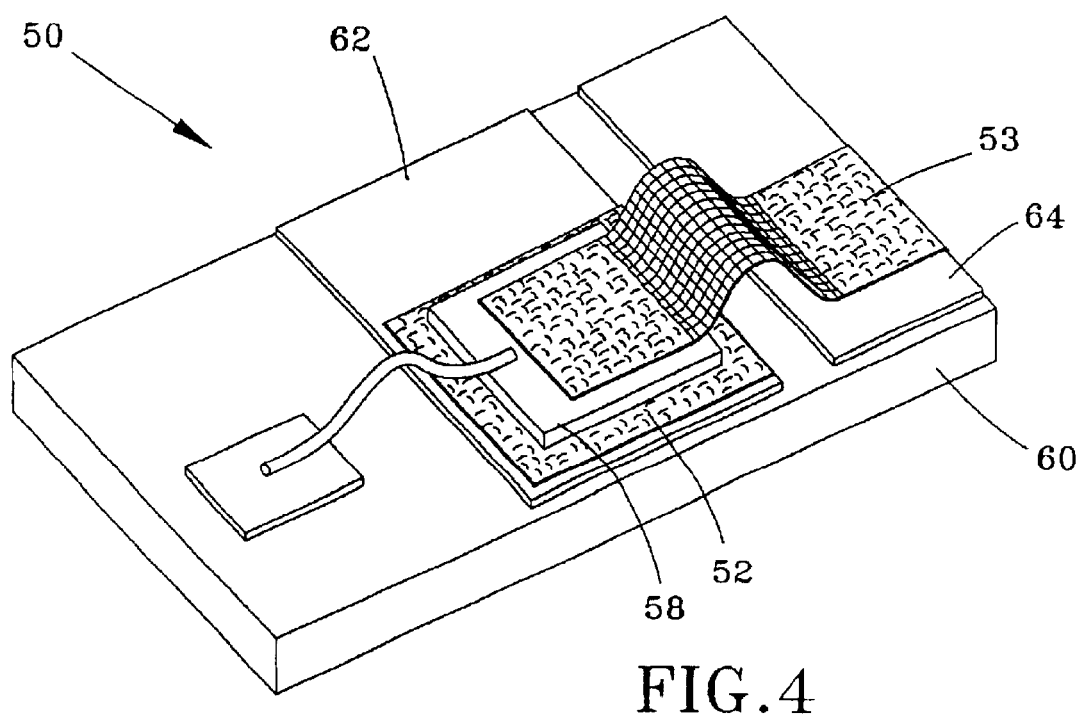

FIG. 4 represents another application for the joint structure of this invention, in which a circuit assembly 50 makes use of a joint structure 52 and an interconnect strap 53, each of which can be formed of a solder-infiltrated mesh similar to the structure 12 of FIGS. 1 and 2. The joint structure 52 is shown as bonding a circuit device 58 to a conductor 62 on a substrate 60, while the interconnect strap 53 interconnects the topside of the device 58 to a second conductor 64 on the substrate 60. The entire interconnect strap 53 may be infiltrated with solder, though preferably the portion of the strap 53 between the device 58 and conductor 64 is free of solder in order to allow the flexibility of the mesh 14 to provide stress relief between the connections to the device 58 and conductor 64. In the application represented by FIG. 4, the joint structure 52 and strap 53 can be simultaneously reflowed if both use the same solder composition. Alternatively, the strap 53 can utilize a lower melting solder than the joint structure 52, in which case the device 58 is reflow soldered with the joint structure 52 to the conductor 62, and then the interconnect strap 53 is reflow soldered at a lower temperature to the device 58 and the second conductor 64, such that the solder of the joint structure 52 does not remelt during the second reflow operation.

Figure 5:
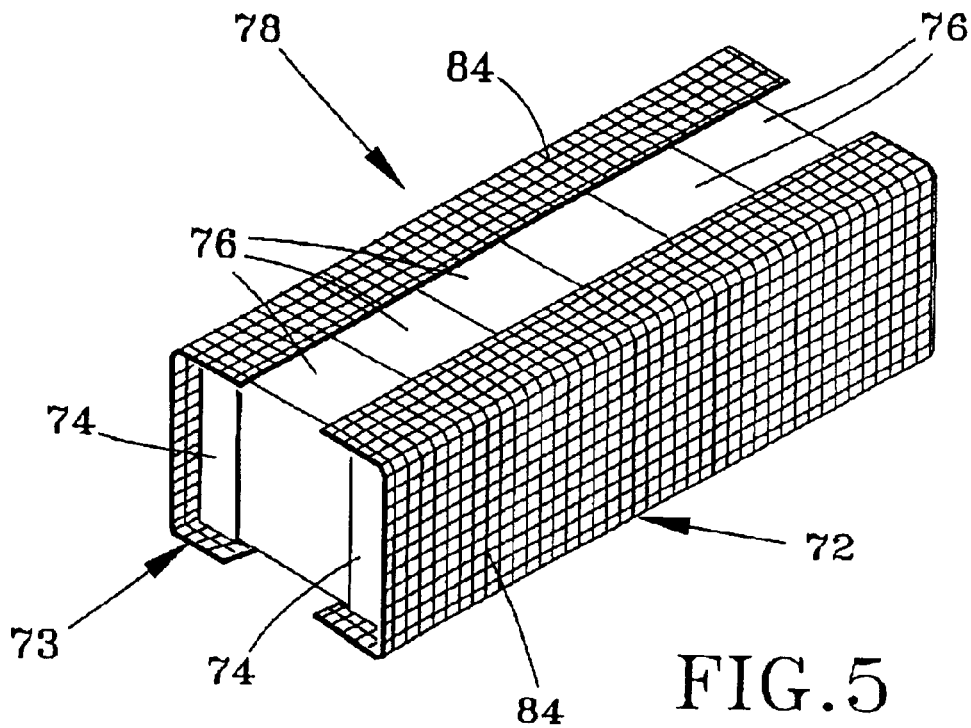
Figure 6:
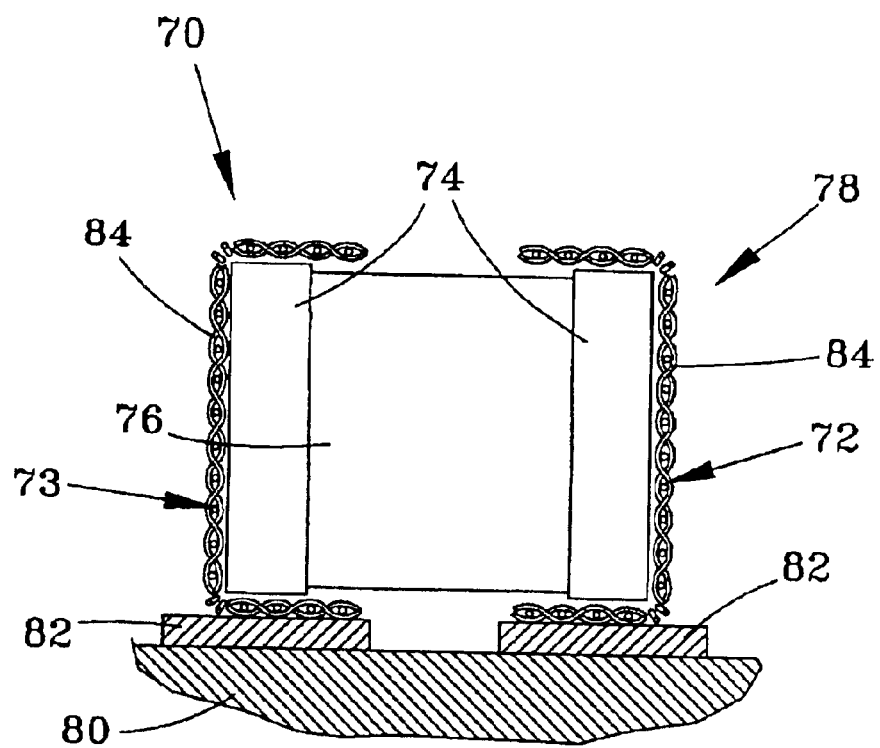

Finally, FIGS. 5 and 6 represent an assembly 70 in which a pair of joint structures 72 and 73 serve as end caps for a large ceramic surface-mounted component 78. As with the previous embodiments of this invention, the joint structures 72 and 73 are each formed of a solder-infiltrated mesh 14 in a manner similar to that shown in FIG. 2. The component 78 is shown as comprising multiple dielectrics 76, each of which is between a pair of contact rails 74 to form a stack of parallel capacitors. The joint structures 72 and 73 are shown as being formed around the contact rails 74 of the component 78, thereby holding the capacitors together for mounting as an assembly to a pair of conductors 82 on a substrate 80, as shown in FIG. 6. A portion of each joint structure 72 and 73 is shown as being positioned between one of the conductors 82 and one set of the rails 74 of the component 78, resulting in a relatively thick solder connection similar to that discussed with the previous embodiments. The thickness of these solder connections may be increased beyond the thickness of the mesh 14 by folding the mesh 14, so that two or more layers of mesh 14 are present between each rail 74 and its conductor 82. The portions of the structures 72 and 73 between the rails 74 and the conductors 82 preferably utilize a solder whose melting temperature is lower than the remaining portions of the structures 72 and 73, which form caps 84 that surround and hold the rails 74 (and therefore the capacitors) together. As a result, the caps 84 can be reflow soldered to the rails 74 to form the component 78, after which the component 78 is attached to the substrate 80 by reflow soldering the structures 72 and 73 at a lower temperature at which the solder bonding the caps 84 to the rails 74 does not remelt.

Stacked capacitors of the type represented by the component 78 are sometimes desirable when limited board space is available. In conventional practice, the opposing contact rails of each stacked capacitor assembly are bonded with a high temperature solder to a pair of stainless steel strain-relieved terminals. The terminals are typically thin to provide strain relief for the CTE mismatch between the dielectrics 76 (e.g., ceramic) and the substrate 80 (e.g., epoxy laminate), but have limited thermal and electrically conductivity as a result of being formed of stainless steel. The terminals are also known to promote void formation in the solder joining the terminals to the rails and conductors. The joint structures 72 and 73 of this invention overcome the disadvantages of the prior art because the mesh can be formed of copper or another suitable material capable of improving the electrical and thermal conductivity of the structures 72 and 73, as well as better distribute shear stresses between the contact rails 74 and the substrate 80, and provide a path for gases to escape from the structures 72 and 73 during soldering.

With each of the applications described above, joint structures formed in accordance with this invention are able to offer improvements in thermal conductivity, electrical conductivity, reflow processing, and stress distribution. These attributes of the joint structures can be tailored to some degree by the choices of materials for the mesh and the solder. For example, some applications may require greater emphasis on thermal and electrical conductivity as compared to stress distribution. Still other applications may impose a limitation on the thickness of the joint structure. Therefore, while the invention has been described in terms of a preferred embodiment, it is apparent that other forms could be adopted by one skilled in the art. Accordingly, the scope of the invention is to be limited only by the following claims.

What is claimed is:

1. An electrical circuit assembly comprising two components bonded together with an electrically-conductive joint structure therebetween, the joint structure comprising a flexible mesh infiltrated by a solder material that bonds the mesh to the components and the components to each other, a solder-free portion of the mesh extending outside of the joint structure and from between the components to define a flexible jumper to a first of the components.

2. The electrical circuit assembly according to claim 1, wherein the mesh is formed of woven strands of copper or copper alloy wire.

3. The electrical circuit assembly according to claim 1, wherein the first of the components is a circuit element and a second of the components is a conductor on a substrate.

4. The electrical circuit assembly according to claim 3, wherein the conductor is a heatsink of the substrate.

5. The electrical circuit assembly according to claim 3, wherein the circuit element is an integrated circuit chip on a surface region of the substrate, and the joint structure contacts a surface of the integrated circuit chip.

6. The electrical circuit assembly according to claim 5, further comprising an interconnect strap contacting the integrated circuit chip and a second surface region of the substrate, the interconnect strap comprising a flexible mesh of which at least two separate portions are infiltrated by a solder material that bonds the mesh to the integrated circuit chip and to the second surface region of the substrate, a third portion of the mesh between the two separate portions being free of the solder material so as to remain flexible.

7. The electrical circuit assembly according to claim 6, wherein the solder material of the interconnect strap has a lower melting temperature than the solder material of the joint structure.

8. The electrical circuit assembly according to claim 6, wherein the interconnect strap is bonded to a third component on the second surface region of the substrate.

9. An electrical circuit assembly comprising two components bonded together with a joint structure, the joint structure comprising a flexible mesh infiltrated by a solder material, wherein a first of the components comprises multiple electrical devices with a first set of terminals, each electrical device comprising a said terminal bonded with the solder material to the joint structure so as to hold the electrical devices together, a second of the components is a conductor on a substrate, and the joint structure bonds the first set of terminals to the conductor.

10. The electrical circuit assembly according to claim 9, further comprising a second joint structure comprising a flexible mesh infiltrated by a solder material, the mesh of the second joint structure being formed of a material having a higher thermal conductivity than the solder material of the second joint structure, the electrical devices having a second set of terminals bonded together with the second joint structure.

11. The electrical circuit assembly according to claim 10, wherein portions of the meshes of each of the joint structure and the second joint structure extend outside of the joint structure and the second joint structure to define two caps that overlie each of the terminals.

12. The electrical circuit assembly according to claim 11, wherein each of the caps comprises a second solder material that infiltrates the portion of the mesh and has a higher melting temperature than the solder materials of the joint structure and the second joint structure.

13. A semiconductor assembly comprising a heat-generating semiconductor device that is attached to a conductor on a substrate with an electrically-conductive joint structure located between the semiconductor device and the conductor, the joint structure comprising an electrically-conductive flexible mesh infiltrated by a solder material that bonds together the semiconductor device, the conductor and the mesh, a solder-free portion of the mesh extending outside of the joint structure and from between the semiconductor device and the conductor to define a flexible jumper to the semiconductor device, the mesh being formed of a material having a higher thermal conductivity than the solder material, the mesh substantially establishing the thickness of the joint structure.

14. The semiconductor assembly according to claim 13, wherein the mesh is formed of woven strands of copper or copper alloy wire.

15. The semiconductor assembly according to claim 13, wherein the conductor is a heatsink of the substrate.

16. The semiconductor assembly according to claim 13, wherein the semiconductor device is an integrated circuit chip, and the joint structure is between and contacts a surface of the integrated circuit chip and a surface of the conductor.

17. The semiconductor assembly according to claim 16, further comprising an interconnect strap contacting a second surface of the integrated circuit chip and a third component on the substrate, the interconnect strap comprising an electrically-conductive flexible mesh having first and second portions at the second surface of the integrated circuit chip and the third component, respectively, and an intermediate portion therebetween, the first and second portions of the mesh being infiltrated by a solder material that bonds the mesh to the second surface of the integrated circuit chip and to the third component while the intermediate portion is substantially free of a solder material so as to remain flexible.

18. The semiconductor assembly according to claim 17, wherein the solder material of the interconnect strap has a lower melting temperature than the solder material of the joint structure.

19. A method of bonding together two components with an electrically-conductive joint structure, the method comprising the steps of placing a first portion of a flexible mesh between the components and bonding the first portion of the mesh to the components with a solder material that infiltrates the first portion of the mesh but does not infiltrate a second portion of the mesh, the first portion of the mesh and the solder material forming the joint structure between the components, the second portion of the mesh extending outside of the joint structure and from between the components to define a solder-free flexible jumper to a first of the components.

20. The method according to claim 19, wherein the mesh is formed of woven strands of copper or copper alloy wire.

21. The method according to claim 19, wherein the first of the components is a circuit element and a second of the components is a conductor on a substrate, and the forming step comprises bonding the circuit element to the conductor.

22. The method according to claim 21, wherein the conductor is formed as a heatsink of the substrate.

23. The method according to claim 21, wherein the circuit element is an integrated circuit chip on a surface region of the substrate, and the joint structure contacts a surface of the integrated circuit chip.

24. The method according to claim 23, further comprising the steps of contacting a second surface of the integrated circuit chip and a second surface region of the substrate with two separate portions of an interconnect strap comprising a flexible mesh, and infiltrating the separate portions with a solder material to bond the mesh to the integrated circuit chip and to the second surface region of the substrate, a third portion of the mesh between the two separate portions remaining free of the solder material so as to remain flexible.

25. The method according to claim 24, wherein the solder material of the interconnect strap has a lower melting temperature than the solder material of the joint structure.

26. The method according to claim 24, further comprising the step of bonding the interconnect strap to a third component on the second surface region of the substrate.

27. A method of bonding together two components with a joint structure, the method comprising the step of forming the joint structure of a flexible mesh infiltrated by a solder material, wherein a first of the components is a circuit element comprising multiple electrical devices, each electrical device comprising a terminal that cooperates to form a first set of terminals, a second of the components is a conductor on a substrate, and the joint structure is formed by infiltrating the mesh with the solder material so that the solder material bonds the first set of terminals to the mesh so as to hold the electrical devices together and so that the solder material bonds the mesh to the conductor so as to attach the first component to the conductor.

28. The method according to claim 27, further comprising the step of forming a second joint structure to bond together a second set of terminals of the electrical devices, the second joint structure comprising a flexible mesh infiltrated by a solder material, the mesh of the second joint structure being formed of a material having a higher thermal conductivity than the solder material of the second joint structure.

29. The method according to claim 28, wherein the joint structure and the second joint structure are formed so that portions of their respective meshes extend outside of the joint structure and the second joint structure to define two caps that overlie each of the terminals.

30. The method according to claim 29, wherein each of the caps comprises a second solder material that infiltrates the portion of the mesh and has a higher melting temperature than the solder materials of the joint structure and the second joint structure.

31. A method of attaching a heat-generating semiconductor device to a conductor on a substrate with an electrically-conductive joint structure, the method comprising the steps of:

provdiing on the conductor a preliminary structure comprising a flexible mesh and a solder material, the mesh being formed of a material having a higher thermal conductivity than the solder material;

placing the semiconductor device on the preliminary structure so that the solder material and a first portion of the mesh is between the semiconductor device and the conductor and a second portion of the mesh is not between the semiconductor device and the conductor; and then forming the joint structure by heating the preliminary structure so that the solder material melts, infiltrates the first portion of the mesh, and bonds together the semiconductor device, the conductor and the first portion of the mesh, the second portion of the mesh extending outside of the joint structure and from between the semiconductor device and the conductor to define a solder-free flexible jumper to the semiconductor device, the mesh substantially establishing the thickness of the joint structure.

32. The method according to claim 31, wherein the mesh is formed of woven strands of copper or copper alloy wire.

33. The method according to claim 31, wherein the conductor is formed as a heatsink of the substrate.

34. The method according to claim 31, wherein the semiconductor device is an integrated circuit chip, and the joint structure is formed between and contacts a surface of the integrated circuit chip and a surface of the conductor.

35. The method according to claim 34, further comprising the steps of contacting a second surface of the integrated circuit chip and a third component on the substrate with first and second portions, respectively, of an interconnect strap comprising a flexible mesh, and infiltrating, the first and second portions of the mesh with a solder material to bond the mesh to the integrated circuit chip and to the third component, an intermediate portion of the mesh between the first and second portions remaining free of the solder material so as to remain flexible.

36. The method according to claim 35, wherein the solder material of the interconnect strap has a lower melting temperature than the solder material of the joint structure.

* * * * *